US011545942B2

(12) United States Patent
Tymofieiev (10) Patent No.: US 11,545,942 B2
(45) Date of Patent: Jan. 3, 2023

(54) PUSH-PULL CLASS E AMPLIFIER

(71) Applicant: Ampleon Netherlands B.V., Nijmegen (NL)

(72) Inventor: Yevhen Tymofieiev, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 1 day.

(21) Appl. No.: 17/369,572

(22) Filed: Jul. 7, 2021

(65) Prior Publication Data
US 2022/0014159 A1     Jan. 13, 2022

(30) Foreign Application Priority Data

Jul. 8, 2020    (NL) ...................................... 2026017

(51) Int. Cl.
*H03F 3/217*       (2006.01)
*H03F 3/26*       (2006.01)

(52) U.S. Cl.
CPC ........... *H03F 3/2176* (2013.01); *H03F 3/265* (2013.01); *H03F 2200/06* (2013.01)

(58) Field of Classification Search
CPC .... H03F 3/2176; H03F 3/265; H03F 2200/06; H03F 3/195; H03F 3/213; H03F 3/601; H03F 2200/21; H03F 1/56; H03F 3/3033; H03F 2200/09; H03F 2200/297; H03F 2200/315; H03F 2200/387; H03F 2200/451; H03F 2200/534; H03F 2200/541; H03F 3/3001
USPC ........................ 330/251, 207 A, 10, 262–264
See application file for complete search history.

(56) References Cited

U.S. PATENT DOCUMENTS

| 5,644,272 | A | 7/1997 | Dabrowski | |
|---|---|---|---|---|
| 7,714,649 | B1* | 5/2010 | Cripe | H03F 1/0294 330/251 |
| 8,344,801 | B2* | 1/2013 | Owen | H03F 3/265 330/196 |

OTHER PUBLICATIONS

PCT International Search Report and Written Opinion, Application No. NL2026017, dated Jul. 8, 2020, 10 pages.

* cited by examiner

*Primary Examiner* — Hieu P Nguyen
(74) *Attorney, Agent, or Firm* — McDonnell Boehnen Hulbert & Berghoff LLP (57) ABSTRACT

Example embodiments relate to push-pull class E amplifiers. One example push-pull class E amplifier includes an input configured for receiving a signal to be amplified. The push-pull class E amplifier also includes an output configured for outputting the signal after amplification. Additionally, the push-pull class E amplifier includes a printed circuit board having a first dielectric layer and a second dielectric layer. Further, the push-pull class E amplifier includes a first amplifying unit and a second amplifying unit. Yet further, the push-pull class E amplifier includes a balun, a capacitive unit, a first line segment, a second line segment, a third line segment, and a fourth line segment. The first line segment and the second line segment are arranged on the first dielectric layer. A combined length of the third line segment and the fourth line segment corresponds to a quarter wavelength of an operational frequency of the amplifier.

16 Claims, 6 Drawing Sheets

PUSH-PULL CLASS E AMPLIFIER

CROSS-REFERENCE TO RELATED APPLICATIONS

The present application is a non-provisional patent application claiming priority to Netherlands Patent Application No. NL 2026017, filed Jul. 8, 2020, the contents of which are hereby incorporated by reference.

FIELD OF THE DISCLOSURE

The present disclosure relates to a push-pull class E amplifier. Furthermore, the present disclosure relates to a device comprising such a push-pull solid state amplifier for industrial, scientific and medical applications like RF heating, drying and defrosting, and magnetic resonance imaging. Such device could for example be incorporated in plasma generation devices, laser systems, and particle accelerators.

BACKGROUND

A push-pull amplifier typically comprises a first amplifying unit having a first input and a first output, and a second amplifying unit having a second input and a second output. The first and second amplifying units are driven with a 180 degrees phase offset relative to each other. To that end, a signal received at an input of the amplifier is distributed to the first input and the second input with a 180 degrees phase difference. Typically, the input of the amplifier is unbalanced, and a balun may be used for transforming the unbalanced input signal into balanced signals that are fed to the first and second inputs.

SUMMARY

Figure 1:
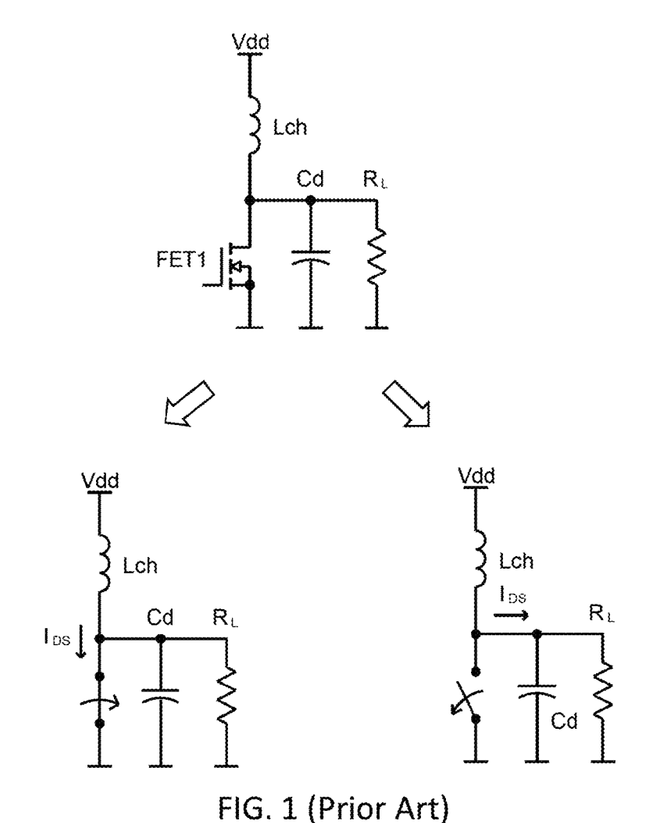
FIG. 1 illustrates the operational principles of a known class E amplifier, according to the prior art.

A class E amplifier is an amplifier in which the transistor is used as a switch. FIG. 1 illustrates the operational principles of a class E amplifier. In this figure, the drain of a field-effect transistor FET1 is connected to a radiofrequency 'RF' choke Lch through which a DC bias Vdd is provided. Furthermore, the drain is connected to shunt capacitor Cd and load $R_L$.

The gate of FET1 is driven such that FET1 is either fully opened, shown in the bottom right figure, or fully closed, shown in the bottom left figure. When closed, a current Ids flows through Lch and through FET1. At this moment, the voltage over Cd is preferably as low as possible. When FET1 is opened, the stored magnetic energy is released from Lch through a current Ids that flows through Cd and $R_L$. When again closing FET1, the voltage over Cd is preferably very low and the cycle may be repeated. When operated in this manner, the overlap in time between a current flowing through FET1 and a drain-source voltage being larger than 0V can be limited thereby reducing power consumption inside FET1 and improving efficiency.

Figure 2:
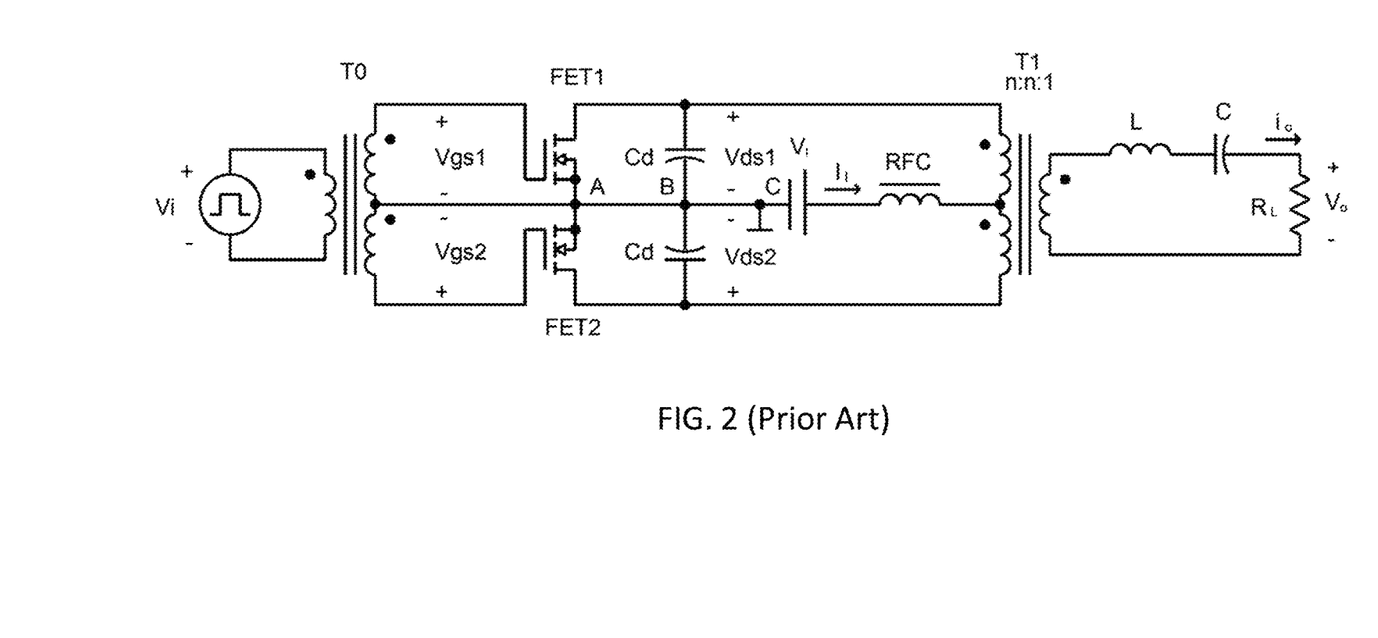
FIG. 2 illustrates a known push-pull class E amplifier, according to the prior art.

Push-pull class E amplifiers are known in the art. An example thereof is shown in FIG. 2. In this figure, the amplifier comprises an input transformer T0 by which an unbalanced signal $V_i$ received at the input is distributed as a balanced signal over the inputs of the field-effect transistors FET1, FET2, where it is supplied as gate-source voltages $V_{gs1}$ and $V_{gs2}$. Here, the sources of FET1 and FET2 are connected at node A. The drains of transistors FET1, FET2 are connected to capacitors Cd that are mutually connected at a node B. Instead of two capacitors Cd to ground, a single capacitor arranged in between the drains of FET1, FET2 could equally be used. In FIG. 2, the drain-source voltage of FET1, FET2 is indicated as $V_{ds1}$ and $V_{ds2}$, respectively.

The drain of each field-effect transistor FET1, FET2 is connected to a part of the primary side of a transformer T1. The secondary side of the transformer T1 is connected to a load $R_L$ via a series resonance circuit of a capacitor C and an inductor L. This latter resonance circuit is configured to resonate at a frequency within the operational frequency range of the amplifier. This circuit can be used to reject higher harmonics.

Transistors FET1, FET2 are fed using a voltage source $V_1$ via a choke inductor RFC that is connected to a virtual ground point on the primary side of transformer T1. It is further noted that nodes A and B, which also act as virtual grounds, are connected to a physical ground at node C.

The amplifier of FIG. 2 could be implemented on a printed circuit board that comprises a dielectric layer. More in particular, transformer T1 could be realized using a quarter wavelength balun. In this case, the primary side of transformer T1 could be formed using a first line segment having a first end connected to the output, e.g. drain, of FET1 and a second line segment having a first end connected to the output of FET2. The second ends of the first and second line segments would then be connected to each other. The first and second line segments could form a loop and could be arranged on a first side of the dielectric layer of the printed circuit board. Together with capacitors Cd, the first and second line segments would form part of a class E matching network.

The secondary side of transformer T1 could be formed using a third line segment that is arranged on a side of the dielectric layer opposite to the first side. A first end of the third line segment could be connected to ground and the second end of the third line segment could be connected to load $R_L$, either directly or via impedance matching and/or harmonics filtering stages. The third line segment could form a second loop comprising m turns. Moreover, the first line segment, second line segment, and the third line segment could be formed using coupled transmission lines.

In the quarter wavelength balun, the length of the third line segment corresponds to a quarter wavelength at a frequency lying within the operational frequency range of the amplifier. Moreover, the length of the first line segment and the length of the second line segment would then each correspond to an eighth of a wavelength divided by m at the frequency lying within the operational frequency range of the amplifier.

When operating at high output powers, i.e. >500 W, at relatively low frequencies, i.e. <200 MHz, it is imperative that the first and second line segments are not too narrow due to the excessive currents that may flow in them. Furthermore, under these conditions, the output impedance of transistors FET1, FET2 will be relatively low. To provide an acceptable impedance match to load $R_L$, the third line segment preferably comprises as much turns as possible. However, for most amplifiers, a space for such turns is limited so that only 2 or 3 turns can be used.

It is an object of the present invention to provide an amplifier of the type described above in which for a given physical amplifier size more output power may be generated.

According to the present invention, this object is achieved using an amplifier as defined in claim 1. This amplifier comprises a printed circuit board comprising a first and second dielectric layer. The amplifier of the invention differs from the amplifier shown in FIG. 2 when implemented using a quarter wavelength balun in that the third line segment is arranged in between the first and second dielectric layers. Moreover, the amplifier comprises a fourth line segment that is arranged on the second dielectric layer on a side facing away from the first dielectric layer and having a first end and a second end. The fourth line segment forms a third loop comprising n turns. The first end of the fourth line segment is connected to the second end of the third line segment through a via extending through the second dielectric layer, and the second end of the fourth line segment is connected to the amplifier output.

The third line segment and the fourth line segment are formed using coupled transmission lines. It is noted that the fourth line segment only has a very weak coupling to the first and second line segment due to the shielding of the third line segment. For the first, second, third, and fourth line segments, microstrip line or strip line technology could be used.

According to the invention, a combined length of the third line segment and the fourth line segment equals a quarter wavelength at the frequency lying within the operational frequency range of the amplifier. A length of the first line segment and a length of the second line segment each correspond to an eighth of a wavelength divided by (n+m) at the frequency lying within the operational frequency range of the amplifier.

The Applicant has found that, despite the shielding by the third line segment, adding a fourth line segment provides a substantial advantage. More in particular, the addition of the fourth line segment allows the first and second line segments to be shortened. This allows a higher capacitance value to be used for capacitors Cd, which in turn results in a higher output power.

In an embodiment, at least m or n can be greater than 1. For example, both m and n may equal 2.

The first and second line segments may occupy a first ring-shaped surface area on the first dielectric layer. The third line segment and the fourth line segment may occupy a second and third ring-shaped surface area, respectively, that, when projected onto the first surface area in a direction perpendicular to the printed circuit board, substantially fall within the first surface area. For example, the first and second line segment may form a circular ring having an inner radius and an outer radius relative to a center of the ring. The third line segment and fourth line segment may each comprise one or more turns that extend around a respective center that is aligned in lateral direction with the center of the ring formed by the first and second line segments. The one or more turns of the third and fourth line segments extend in an area defined by the abovementioned inner and outer radius relative to the respective center. An inner and/or an outer perimeter of the first, second, and third ring-shaped areas may each have a square shape, a rectangular shape, a circular shape or oval shape.

For example, the push-pull class E amplifier may further comprise a first ground patch around which the first loop extends, a second ground patch around which the second loop extends, and a third ground patch around which the third loop extends, a surface area of the first, second, and third ground patches being substantially identical, and the first, second, and third ground patches being electrically connected using one or more vias extending through the first and/or second dielectric layers. Typically, the first, second, and third ground patches are aligned in the lateral direction.

The push-pull class E amplifier may further comprise a first grounded surrounding area surrounding the first loop, a second grounded surrounding area surrounding the second loop, and a third ground surrounding area surrounding the third loop. The first, second, and third grounded surrounding areas are electrically connected to each other using one or more vias extending through the first and/or second dielectric layers.

The first end of the third line segment can be physically and electrically connected to the second grounded surrounding area.

The push-pull class E amplifier may further comprise one or more electrically isolating thermal bridges, each thermal bridge connecting the first or second line segment to the first ground patch or the first grounded surrounding area. These thermal bridges may for instance be realized using a suitable ceramic material, such as aluminum nitride or beryllium oxide, and allow the first and second line segments, which carry the most current, to be sufficiently cooled.

The turn(s) of the third line segment may run in the same direction around the second ground patch as the turn(s) of the fourth line segment around the third ground patch.

The first amplifying unit and the second amplifying unit may each be comprised in a package that comprises a pair of separate and spaced apart connecting terminals, said connecting terminals being connected inside the package to the first and second outputs, respectively. The package can be mounted on the first dielectric layer. The connecting terminals may be in the form of leads.

The package may comprise a first and second power transistor, each of the first and second power transistor being a silicon based laterally diffused metal-oxide-semiconductor, 'LDMOS', transistor, a vertical double-diffused metal-oxide semiconductor, 'VDMOS', transistor, or a gallium nitride based field-effect transistor, 'FET'.

The first and second line segments can be capacitively coupled to ground at or near a point where they are connected. In this manner, the point at which they are connected can be RF shorted to ground without introducing a DC path to ground.

Each of the first and second line segments can be connected to a respective biasing network for supplying DC current to the first and second amplifying units, respectively, wherein the biasing networks are part of the class E matching network. Alternatively, a single biasing network can be used for simultaneously biasing the first and second amplifying units. Such biasing network could be configured to provide DC current at or near a point where the first and second line segments are connected or another virtual ground point, for example as indicated by nodes A or B in FIG. 2.

The operational frequency range may lie in a range from 1 MHz to 200 MHz. Moreover, a power of the outputted signal may lie in a range from 100 W to 10 kW.

According to a second aspect, the present invention relates to a balun for transforming a balanced signal received at a first and second balanced terminal into an unbalanced signal outputted at an unbalanced terminal. The balun comprises a printed circuit board having a first dielectric layer and a second dielectric layer. The balun further comprises a first line segment having a first end and a second end, the first end of the first line segment being coupled to the first balanced terminal, and a second line segment having a first end and a second end, the first end of the second line segment being coupled to the second balanced terminal. The second ends of the first and second line segments are connected to each other, and the first line segment and the second line segment are arranged on the first dielectric layer. Moreover, the first and second line segments form a first loop.

The balun further comprises a third line segment arranged in between the first and second dielectric layers and having a first and second end, wherein the first end is connected to ground. The third line segment forms a second loop comprising m turns. In addition, the balun comprises a fourth line segment arranged on the second dielectric layer on a side facing away from the first dielectric layer and having a first end and a second end, the first end of the fourth line segment being connected to the second end of the third line segment through a via extending through the second dielectric layer, and the second end of the fourth line segment being connected to the unbalanced terminal. The fourth line segment forms a third loop comprising n turns.

A combined length of the third line segment and the fourth line segment corresponds to a quarter wavelength at a frequency lying within an operational frequency range of the balun. A length of the first line segment and a length of the second line segment each corresponds to an eighth of a wavelength divided by (n+m) at the frequency lying within the operational frequency range of the amplifier. In addition, the first line segment, second line segment, and the third line segment are formed using coupled transmission lines, and the third line segment and the fourth line segment are formed using coupled transmission lines.

According to a third aspect, the present invention provides an electronic device comprising the abovementioned push-pull class E amplifier or balun.

BRIEF DESCRIPTION OF THE DRAWINGS

Next, the invention will be described in more detail by referring to the appended drawings, wherein.

DETAILED DESCRIPTION

Figure 3:
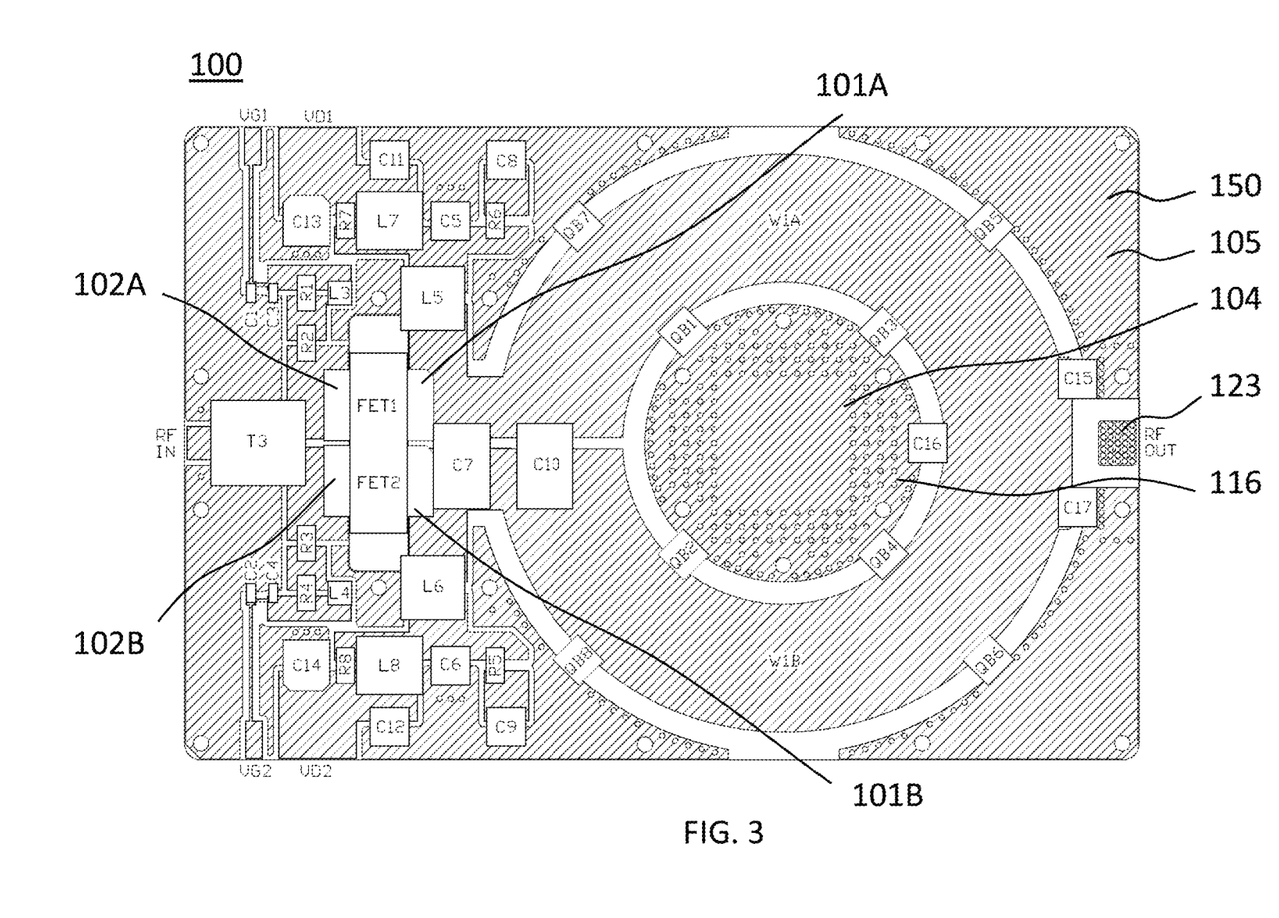
FIG. 3 illustrates an embodiment of a push-pull class E amplifier, according to example embodiments.
Figure 4:
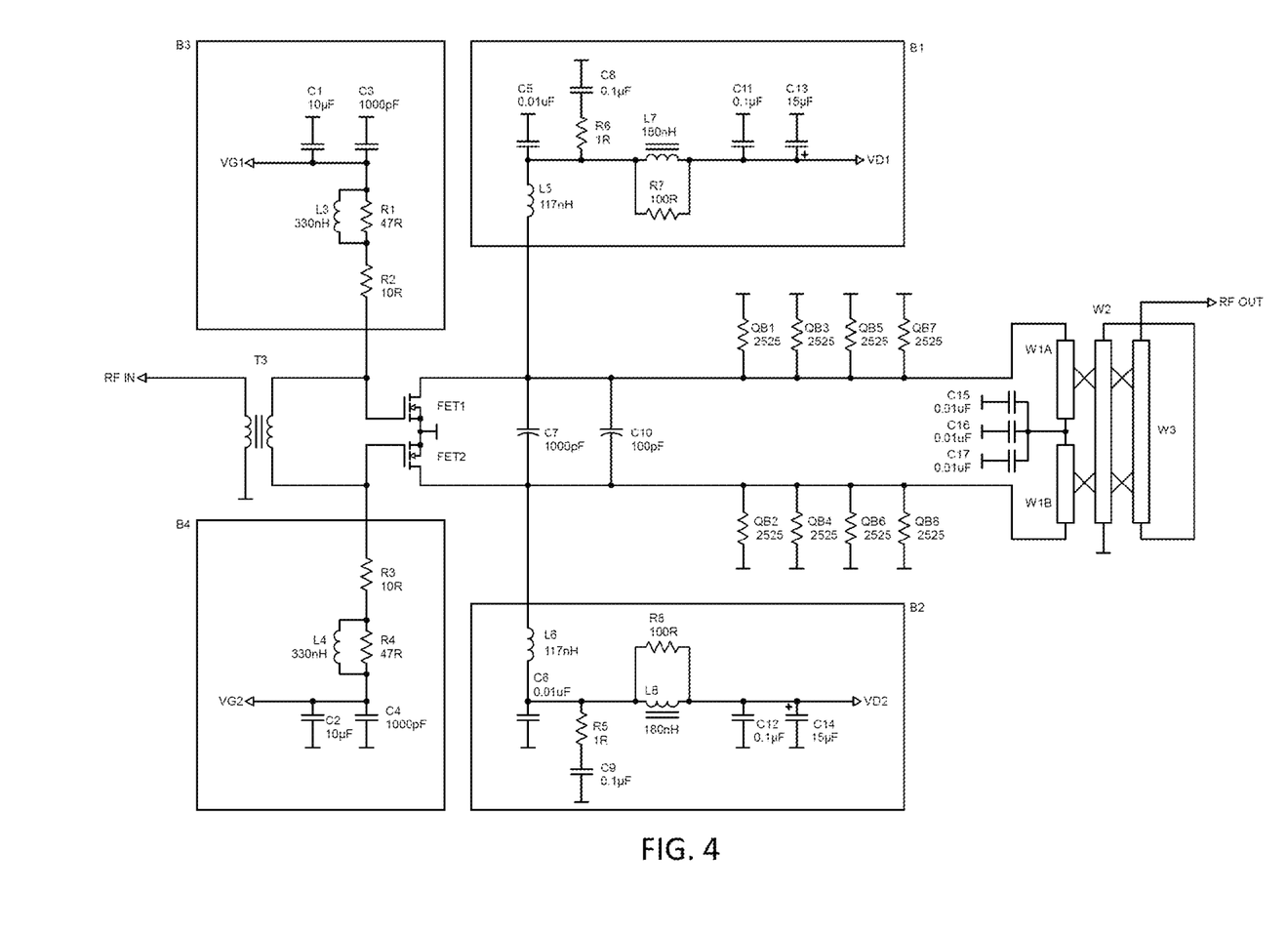
FIG. 4 illustrate an electrical equivalent circuit for the amplifier of FIG. 3, according to example embodiments.

FIG. 3 illustrates an embodiment of a push-pull class E amplifier according to the invention. The electrical equivalent of this amplifier is shown in FIG. 4.

In FIG. 3, a package 100 is shown in which two LDMOS power transistors are arranged, FET1 and FET2, although GaN FETs, VDMOS transistors, or a combination thereof could equally be used. An equivalent circuit of package 100 is shown in FIG. 4.

Each of the transistors has its own output lead 101A, 101B and input lead 102A, 102B, which are connected to a metal layer on a first dielectric layer of a printed circuit board 150. The upper transistor is connected to a first line segment W1A and the lower transistor to a second line segment W1B. These segments form a first loop around a ground patch 104. Other than ground patch 104, grounded surrounding areas 105 are provided. The point where line segments W1A, W1B are physically connected is RF shorted using capacitors C15, C16, C17. In addition, thermal bridges QB1-QB8 are provided to ensure proper cooling of line segments W1A, W1B during operation.

Capacitors Cd from FIG. 2 are realized using capacitors C7, C10. Biasing networks B1 and B2 are used for supplying DC power to the output of the power transistors. Here, biasing network B1 comprises resistors R6, R7, inductors L5, L7, and capacitors C5, C8, C11, C13. Similarly, biasing network B2 comprises resistors R5, R8, inductors L6, L8, and capacitors C6, C9, C12, C14.

Similar biasing networks B3, B4 are provided at the input. Here, biasing network B3 comprises resistors R1, R2, inductor L3, and capacitors C1, C3. Similarly, biasing network B4 comprises resistors R3, R4, inductor L4, and capacitors C2, C4.

A transformer network T3 is used for transforming the unbalanced signal received at the input RF IN to a balanced signal to be fed to the power transistors inside package 100.

Figure 5:
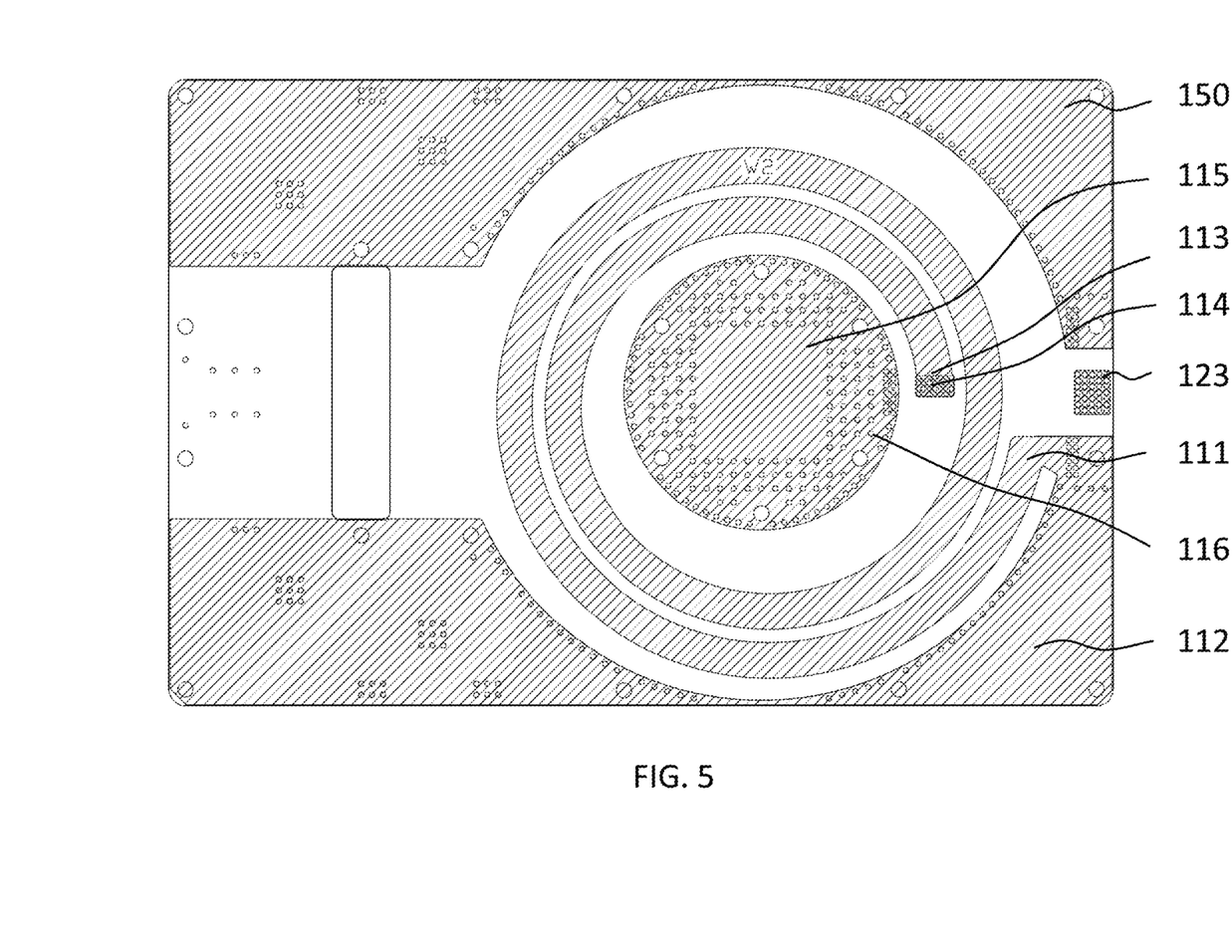
FIG. 5 illustrates the second metal layer of the printed circuit board used in the amplifier of FIG. 3, according to example embodiments.
Figure 6:
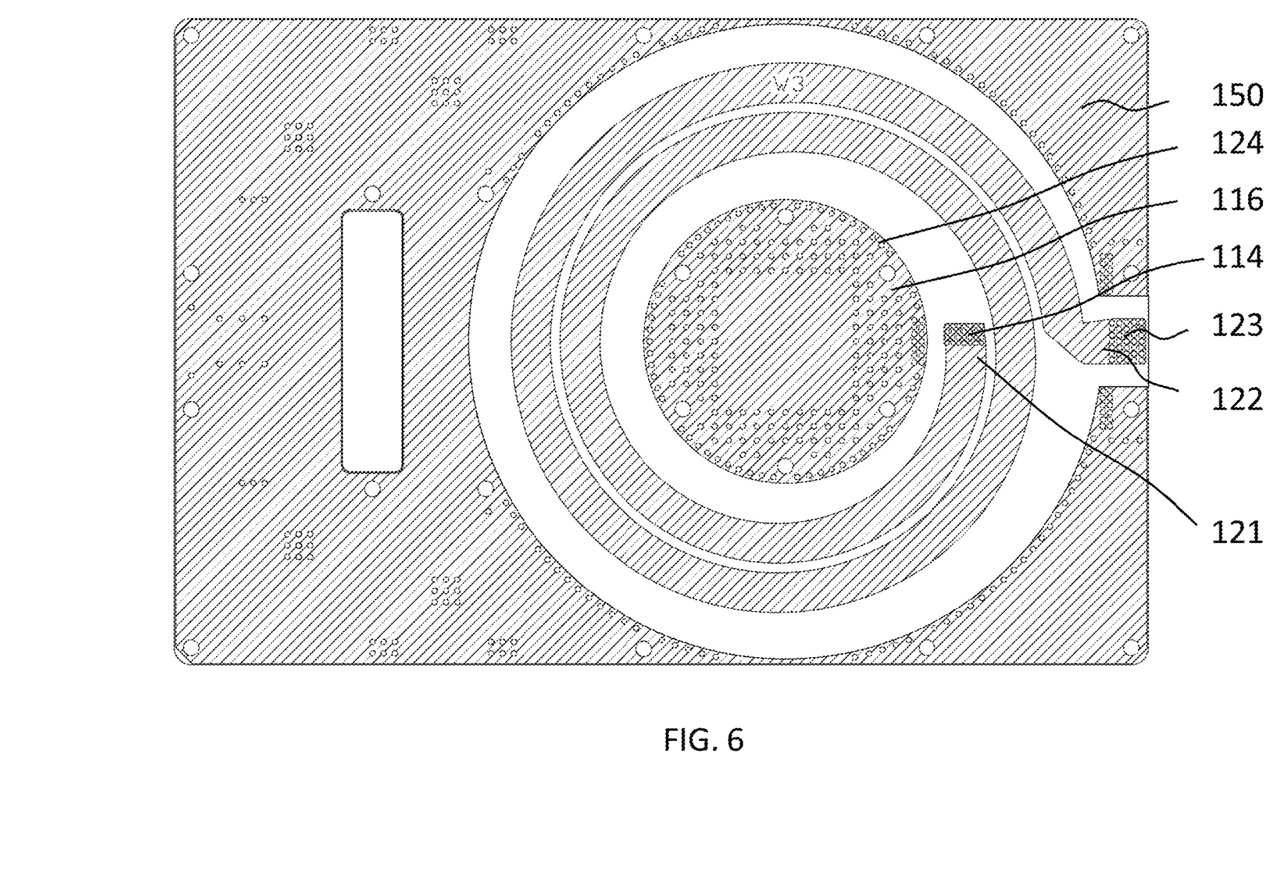
FIG. 6 illustrates the third metal layer of the printed circuit board used in the amplifier of FIG. 3, according to example embodiments.

FIGS. 5 and 6 illustrate the inner metal layers of printed circuit board 150. In FIG. 5, a third line segment W2 is shown that at one end 111 is connected to a grounded surrounding area 112. The other end 113 is connected using a plurality of vias 114 to a fourth line segment W3 that is shown in FIG. 6. Third line segment W2 makes two turns around a central ground patch 115 that is aligned with ground patch 104 and that is electrically connected thereto and to ground patch 124 using multiple vias 116. As shown, the area occupied by third line segment W2 roughly corresponds to the area occupied by first and second line segments W1A, W1B. As shown in FIG. 6, the same holds for fourth line segment W3. This latter segment has an end 121 connected to end 113 of third line segment W2 and an other end 122 to an output RF OUT of the amplifier using a plurality of vias 123 that extend through the first and second dielectric layers. Fourth line segment W3 makes two turns around a central ground patch 124, which patch is electrically connected to patches 115, 104 using vias 116.

As seen in FIG. 5, when starting at end 111, third line segment W2 and fourth line segment W3 each run clockwise around their respective ground patches 115, 124.

By using the additional turns in fourth line segment W3, the length of line segments W1A, W1B is reduced. This allows (a) larger capacitance(s) to be chosen that is/are arranged in between the outputs of the amplifying units. With a given Vdd, this will in turn increase the power that can be outputted by the amplifier while at the same time reducing the physical size of the amplifier.

In the above, the present invention has been explained using detailed embodiments thereof. However, the present invention is not limited to these embodiments. Rather, different modifications are possible without deviating from the scope of the present invention that is described by the appended claims and their equivalents.

For example, although the present embodiments feature a third and a fourth line segment, the present invention equally relates to embodiments in which more line segments are realized in different metal layers.

What is claimed is:

1. A push-pull class E amplifier, comprising:
an input configured for receiving a signal to be amplified;
an output configured for outputting the signal after amplification;
a printed circuit board having a first dielectric layer and a second dielectric layer;
a first amplifying unit having a first input and a first output;
a second amplifying unit having a second input and a second output, the first and second amplifying unit being configured to operate in class E;

a balun having an unbalanced port connected to the input, and a first balanced port connected to the first input and a second balanced port connected to the second input;

a capacitive unit comprising a capacitor coupled between the first output and ground and a capacitor between the second output and ground, or a capacitor coupled between the first and second outputs;

a first line segment having a first end and a second end, the first end of the first line segment being coupled to the first output;

a second line segment having a first end and a second end, the first end of the second line segment being coupled to the second output, and the second ends of the first and second line segments being connected to each other, the first and second line segments and the capacitive unit forming part of a class E matching network for the first and second amplifying units;

wherein the first line segment and the second line segment are arranged on the first dielectric layer;

the push-pull class E amplifier further comprising:

a third line segment arranged in between the first and second dielectric layers and having a first and second end, wherein the first end is connected to ground;

a fourth line segment arranged on the second dielectric layer on a side facing away from the first dielectric layer and having a first end and a second end, the first end of the fourth line segment being connected to the second end of the third line segment through a via extending through the second dielectric layer, and the second end of the fourth line segment being connected to the amplifier output;

wherein a combined length of the third line segment and the fourth line segment corresponds to a quarter wavelength at a frequency lying within an operational frequency range of the amplifier;

wherein the first and second line segments form a first loop;

wherein the third line segment forms a second loop comprising m turns;

wherein the fourth line segment forms a third loop comprising n turns;

wherein a length of the first line segment and a length of the second line segment each corresponds to an eighth of a wavelength divided by (n+m) at the frequency lying within the operational frequency range of the amplifier;

wherein the first line segment, second line segment, and the third line segment are formed using coupled transmission lines; and wherein the third line segment and the fourth line segment are formed using coupled transmission lines.

2. The push-pull class E amplifier of claim 1, wherein at least m or n is greater than 1.

3. The push-pull class E amplifier of claim 1, wherein the first and second line segments occupy a first ring-shaped surface area on the first dielectric layer, and wherein the third line segment and the fourth line segment occupy a second and third ring-shaped surface area, respectively, that, when projected onto the first surface area in a direction perpendicular to the printed circuit board, substantially fall within the first surface area, wherein an inner and/or an outer perimeter of the first, second, and third ring-shaped areas each have a square shape, a rectangular shape, a circular shape or oval shape.

4. The push-pull class E amplifier of claim 3, further comprising a first ground patch around which the first loop extends, a second ground patch around which the second loop extends, and a third ground patch around which the third loop extends, a surface area of the first, second, and third ground patches being substantially identical, and the first, second, and third ground patches being electrically connected using one or more vias extending through the first and/or second dielectric layers.

5. The push-pull class E amplifier of claim 4, further comprising a first grounded surrounding area surrounding the first loop, a second grounded surrounding area surrounding the second loop, and a third ground surrounding area surrounding the third loop, the first, second, and third grounded surrounding areas being electrically connected to each other using one or more vias extending through the first and/or second dielectric layers.

6. The push-pull class E amplifier of claim 5, wherein the first end of the third line segment is physically and electrically connected to the second grounded surrounding area.

7. The push-pull class E amplifier of claim 4, further comprising one or more electrically isolating thermal bridges, each thermal bridge connecting the first or second line segment to the first ground patch or the first grounded surrounding area.

8. The push-pull class E amplifier of claim 4, wherein the turn(s) of the third line segment run in the same direction around the second ground patch as the turn(s) of the fourth line segment around the third ground patch.

9. The push-pull class E amplifier of claim 1, wherein the first amplifying unit and second amplifying unit are comprised in a package that comprises a pair of separate and spaced apart connecting terminals, said connecting terminals being connected inside the package to the first and second outputs, respectively, the package being mounted on the first dielectric layer.

10. The push-pull class E amplifier of claim 9, wherein the package comprises a first and second power transistor, each of the first and second power transistor being a silicon based laterally diffused metal-oxide-semiconductor, 'LDMOS', transistor, a vertical double-diffused metal-oxide semiconductor, 'VDMOS', transistor, or a gallium nitride based field-effect transistor, 'FET'.

11. The push-pull class E amplifier of claim 1, wherein the first and second line segments are capacitively coupled to ground at or near a point where they are connected.

12. The push-pull class E amplifier of claim 1, wherein each of the first and second line segments is connected to a respective biasing network for supplying DC current to the first and second amplifying units, respectively, said biasing networks being part of the class E matching network.

13. The push-pull class E amplifier of claim 1, further comprising a biasing network for supplying DC current to the first and second amplifying units at or near a point where the first and second line segments are connected.

14. The push-pull class E amplifier of claim 1, wherein the operational frequency range lies in a range from 1 MHz to 200 MHz.

15. The push-pull class E amplifier of claim 1, wherein a power of the outputted signal lies in a range from 100 W to 10 kW.

16. An electronic device comprising the push-pull class E amplifier of claim 1, wherein the electronic device is one of a push-pull solid state amplifier for industrial, scientific and medical applications like RF heating, drying and defrosting, and magnetic resonance imaging, wherein the electronic device is incorporated in a plasma generation device, a laser system, and a particle accelerator.

* * * * *